(12) United States Patent
Kohara et al.

(10) Patent No.: US 7,075,960 B2
(45) Date of Patent: Jul. 11, 2006

(54) SEMICONDUCTOR LASER APPARATUS AND PRODUCTION METHOD THEREOF

(75) Inventors: Naoki Kohara, Hirakata (JP); Nobuyuki Iwamoto, Takatsuki (JP); Akira Takamori, Suita (JP); Toshio Matsuda, Otsu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 262 days.

(21) Appl. No.: 10/753,953

(22) Filed: Jan. 9, 2004

(65) Prior Publication Data

US 2004/0161002 A1 Aug. 19, 2004

(30) Foreign Application Priority Data

Jan. 10, 2003 (JP) ............................. 2003-004836
Sep. 12, 2003 (JP) ............................. 2003-321904

(51) Int. Cl.
*H01S 3/04* (2006.01)
(52) U.S. Cl. ..................................... 372/36; 372/43.01
(58) Field of Classification Search ................... 372/36
See application file for complete search history.

(56) References Cited

U.S. PATENT DOCUMENTS

| 5,327,004 A | 7/1994 | Kurusu et al. | |
|---|---|---|---|
| 6,084,895 A * | 7/2000 | Kouchi et al. | 372/36 |
| 6,127,715 A | 10/2000 | Yamamoto et al. | |
| 6,760,297 B1 | 7/2004 | Fujioka et al. | |
| 2005/0067636 A1* | 3/2005 | Amoh et al. | 257/232 |

FOREIGN PATENT DOCUMENTS

| CN | 1173058 A | 2/1998 |
|---|---|---|
| JP | 59-159583 | 9/1984 |
| JP | 64-027288 | 1/1989 |
| JP | 5-275673 | 10/1993 |
| JP | 07-211985 | 8/1995 |
| JP | 9-97892 | 4/1997 |
| JP | 09-326535 | 12/1997 |
| JP | 10-051065 | 2/1998 |
| JP | 11-054850 | 2/1999 |
| JP | 2001-102676 A | 4/2001 |
| JP | 2001-127375 A | 5/2001 |
| JP | 2001-319356 | 11/2001 |
| WO | WO 01/69597 A1 | 9/2001 |

* cited by examiner

*Primary Examiner*—Armando Rodriguez
*Assistant Examiner*—Dung (Michael) T. Nguyen
(74) *Attorney, Agent, or Firm*—McDermott Will & Emery LLP

(57) ABSTRACT

A semiconductor blue-light-laser apparatus for emitting laser beams with high positional accuracy, which is achieved by mounting a semiconductor laser element on a semiconductor substrate with high accuracy and reliability, and a production method of the apparatus. A recess in a surface of the substrate has a p-type layer 100, which is coated with the SiN layer 105, Ti layers 110a and 110b, Au layers 111a and 111b, heat sink layer 113, and solder layer 114. Semiconductor laser element 10 is placed and fixed on Au layer 111b. Heat sink layer 113 is inserted between Au layer 111a and Ti layer 110b and is approximately 20 μm thick. Reflection unit 50 for reflecting laser beams LB includes at the surface thereof Al layer 116 and dielectric layer 117 as a reflection layer that provides a high refractive index for blue light laser beams.

13 Claims, 12 Drawing Sheets

SEMICONDUCTOR LASER APPARATUS AND PRODUCTION METHOD THEREOF

BACKGROUND OF THE INVENTION (1) Field of the Invention

The present invention relates to a semiconductor laser apparatus for use in an optical pickup apparatus or the like, and to a production method thereof.

(2) Description of the Related Art

Optical pickup apparatuses include, for example: a semiconductor laser element for emitting a laser beam onto a target optical disc; a photodetector element for receiving the laser beam reflected off the optical disc, and a signal processing circuit for processing an electric signal generated by the photodetector element based on the received laser beam.

In recent years, for the purpose of downsizing the apparatus and simplifying the alignment adjustment for each optical element, what is called an optical-system-integrated-driving-type semiconductor laser apparatus in which the above-mentioned semiconductor laser element, photodetector element, and signal processing circuit are deposited on a piece of semiconductor substrate has been developed (Japanese Laid-Open Patent Application No. 64-27288).

When, as is the case with the optical-system-integrated-driving-type semiconductor laser apparatus, a semiconductor laser element and a photodetector element are formed on a same substrate, it is required to fix the semiconductor laser element at a given position with great precision. This is because the accuracy in the position of the semiconductor laser element relative to the optical disc to which the laser beam is emitted greatly affects the performance of the apparatus. That is to say, the apparatus's performance is degraded if the semiconductor laser element is positioned and attached with low accuracy.

Japanese Laid-Open Patent Application No. 9-326535 discloses a technology intended to secure the accuracy in attaching the semiconductor laser element to the substrate. According to the technology, a recess is formed in the substrate in advance, and the bump electrode of the semiconductor laser element, which is a source of outgoing laser beams, is inserted in the recess.

Although the technology disclosed in Japanese Laid-Open Patent Application No. 9-326535 has succeeded in increasing the accuracy in attachment of the semiconductor laser element to some extent, the positioning and attachment of the semiconductor laser element along a substrate-thickness direction (a recess-depth direction) is not satisfactory yet for the following reasons. The semiconductor laser element is soldered onto electrodes composed of gold (Au) that have been formed in advance on a surface of the semiconductor substrate. During the bonding process by soldering, a chemical reaction occurs between tin (Sn) element in the solder and Au element in the electrodes, and a distance between the bottom face and the semiconductor laser element is deviated from a desired distance.

In the semiconductor laser apparatus of an optical pickup apparatus, a laser beam emitted from the semiconductor laser element is reflected off a reflection unit placed near the semiconductor laser element, and is output upward outside the apparatus in the substrate-thickness direction. Here, if the semiconductor laser element has been deviated from a desired position along the substrate-thickness direction, the position on the reflection unit at which the emitted laser beam reaches is also deviated from a desired position. This results in a deviation of the reflected laser beam along the direction of the main surface of the apparatus. When such deviations are expected in the manufacturing process of the semiconductor laser apparatus, it is necessary to conduct a positional adjustment of an optical apparatus (for example, a hologram) that is deposited between the semiconductor laser element and the optical disc, for each semiconductor laser apparatus. This positional adjustment, however, is cumbersome and complicated.

As described above, in the semiconductor laser apparatus, a laser beam emitted from the semiconductor laser element is reflected off a reflection unit placed near the semiconductor laser element, and is output upward outside the apparatus in the substrate-thickness direction. It is supposed in both the above-mentioned documents (Japanese Laid-Open Patent Applications No. 64-27288 and No. 9-326535) that an Au layer is used as the reflection layer for reflecting the laser beams, assuming that the laser beams emitted from the semiconductor laser element have a wavelength of red to infrared light. The Au layer, however, is not suited for the blue light, which can also be emitted from the semiconductor laser element. This is because the reflectance of the Au layer for the blue light is lower than that for the red to infrared light due to the material characteristics. That is to say, on the assumption that the semiconductor laser apparatus may emit blue light, it is indispensable to adopt a reflection layer for reflecting blue light with high reflectance.

It is known conventionally that a reflection layer composed of Al has high reflectance in reflecting blue light. However, possibilities of using an Al layer as a reflection layer in semiconductor laser apparatuses have not been fully discussed, nor has been proposed the process for achieving it.

SUMMARY OF THE INVENTION

The object of the present invention is therefore to provide: a semiconductor laser apparatus for emitting laser beams with high positional accuracy, which is achieved by mounting a semiconductor laser element on a semiconductor substrate with high accuracy and reliability; and a production method of the apparatus.

(1) The above object is fulfilled by a semiconductor laser apparatus comprising: a semiconductor substrate whose main surface has a recess, a side wall of the recess having an optical reflector that receives a laser beam and reflects the received laser beam outward in a substrate-thickness direction; a semiconductor laser element that is mounted in the recess and emits the laser beam toward the optical reflector in a direction substantially parallel to the main surface of the semiconductor substrate; a heat sink layer that is formed in a bottom face of the recess so as to adjust a position of the semiconductor laser element in the substrate-thickness direction and to let heat, which is generated as the semiconductor laser element operates, escape toward the semiconductor substrate; a bonding layer formed in contact with a surface, which faces the bottom face of the recess, of the semiconductor laser element; and a diffusion preventing layer that is embedded between the heat sink layer and the bonding layer, possesses electrical conductivity, and prevents a diffusion from occurring between the heat sink layer and the bonding layer.

As stated above, the semiconductor laser apparatus has a diffusion preventing layer inserted between the heat sink layer and the bonding layer. The diffusion preventing layer prevents a diffusion from occurring between the heat sink layer and the bonding layer when the semiconductor laser element is bonded with the bonding layer, thus preventing the bonding layer and a metal electrode layer from changing in volume. In a conventional semiconductor laser apparatus in which the heat sink layer is in direct contact with the bonding layer without such a diffusion preventing layer inserted between them, the constituents of the layers diffuse into other layers each other, making it difficult to secure the positional accuracy in attaching the semiconductor laser element. In contrast, the semiconductor laser apparatus of the present invention can secure the positional accuracy in attaching the semiconductor laser element since the diffusion preventing layer inserted between the layers prevents the constituents of the layers from diffusing into other layers each other.

Accordingly, the semiconductor laser apparatus of the present invention emits laser beams with high positional accuracy since the semiconductor laser element is mounted on the semiconductor substrate with high accuracy and reliability.

(2) In the semiconductor laser apparatus of (1), the diffusion preventing layer may be composed of one or more elements that do not form an alloy phase by reacting with the heat sink layer or the bonding layer, and have an ohmic characteristic electrically. With this arrangement, the electrical ohmic characteristic can be gained securely between the heat sink layer and the bonding layer, and the constituents of the layers are prevented from diffusing into other layers each other.

(3) In the semiconductor laser apparatus of (2), the bonding layer is composed of solder, the heat sink layer is composed of Au, and the diffusion preventing layer is composed of Ti or TiW and is thinner than the heat sink layer. This construction provides an effect of securing high electric conductivity and heat transfer between the semiconductor laser element and the semiconductor substrate, in addition to the effects provided by the semiconductor laser apparatus of (2).

(4) In the semiconductor laser apparatus of (3), a metal thin layer composed of Au or Pt maybe inserted between the bonding layer and the diffusion preventing layer. This arrangement is preferable since it enhances the bonding between the bonding layer and the diffusion preventing layer.

When this arrangement is made, Au or Pt in the metal thin layer reacts with Sn in the bonding layer. However, since the metal thin layer is thinner than the heat sink layer, the variation of the metal thin layer in size due to the reaction is limited to a small range.

Also, when the metal thin layer is inserted between the bonding layer and the diffusion preventing layer, the layer surface is evener than when the metal thin layer is replaced with a diffusion preventing layer of the same thickness (one-layer structure). This provides an advantageous effect of enabling the semiconductor laser element to be bonded (mounted) with high positional accuracy. This also provides an advantageous effect of saving the cost compared with the case where the entire layer is made of the metal thin layer since the metal thin layer composed of Au or Pt is more expensive than the diffusion preventing layer.

(5) In the semiconductor laser apparatus of (3), a layer composed of Ti or TiW and a metal thin layer composed of Au or Pt may be inserted between the bottom face of the recess and the heat sink layer. This arrangement is preferable since it enables the semiconductor laser element to be defined in position (in the substrate-thickness direction) with higher accuracy than when it is defined only with the heat sink layer.

(6) In the semiconductor laser apparatus of (5), the metal thin layer (Au or Pt) may be thinner than the heat sink layer. This arrangement is preferable since it enables the semiconductor laser element to be bonded (mounted) with high positional accuracy.

(7) The semiconductor laser apparatus of claim 3, wherein the optical reflector is surfaced with a metal thin layer composed of Au or Pt and has a slant of substantially 45 degrees with respect to the main surface of the semiconductor substrate. This arrangement is preferable since it enables the surface of the optical reflector to have a reflection structure with high reflectance for laser beams (especially those with a wavelength of no shorter than 600 nm), thus achieving a high-quality, low-cost semiconductor laser apparatus.

It should be noted here that the slant of substantially 45 degrees indicates a slant of 45±5 degrees.

(8) In the semiconductor laser apparatus of (7), the metal thin layer in the surface of the optical reflector may be grounded. This arrangement is preferable since it protects the apparatus from noises.

(9) In the semiconductor laser apparatus of (3), the optical reflector may be a stack of layers including a metal thin layer as a bottom layer composed of Au or Pt, a layer composed of Al, and a dielectric layer as a top layer, a surface of the dielectric layer having a slant of substantially 45 degrees with respect to the main surface of the semiconductor substrate. This arrangement is preferable since it enables the surface of the optical reflector to have a reflection structure with high reflectance for blue light laser beams (having a wavelength of 400 nm to 600 nm), thus achieving a high-quality, low-cost semiconductor blue-light-laser apparatus.

It should be noted here that the slant of substantially 45 degrees indicates a slant of 45±5 degrees.

It is preferable that the dielectric layer is made of $SiO_x$ ($x \leqq 2$) or $MgF_2$, or $Al_2O_3$, $AlF_3$, $CaF_2$, LiF, $CeO_2$ or the like.

It is preferable for the semiconductor laser apparatus to have a diffusion preventing layer composed of Ti or TiW inserted between the metal thin layer and the layer composed of Al since the diffusion preventing layer prevents a reaction between Au in the metal thin layer and Al, contributing to securing the positional accuracy.

(10) In the semiconductor laser apparatus of (9), the metal thin layer in the surface of the optical reflector may be grounded. This arrangement is preferable since it protects the apparatus from noises.

(11) In the semiconductor laser apparatus of (3), the semiconductor substrate may have, at areas near the recess, a photodetector element unit for receiving laser beams, a signal processing circuit unit for processing an electric signal generated by the photodetector element unit, and a bonding pad unit via which signals are input or output from or to outside the semiconductor laser apparatus, and an outermost surface of the semiconductor substrate at an area in which the signal processing circuit unit and the bonding pad unit are formed is covered with a metal thin layer composed of Au or Pt. This arrangement is preferable since the metal thin layer in the outermost surface of the substrate has a shading function and stabilizes the circuit operation, and the metal thin layer at the bonding pad unit contributes to forming an excellent ohmic characteristic when wire bonding is made there. Also, the surface coated with a layer composed of Au or Pt contributes to protecting the apparatus against corrosion.

(12) In the semiconductor laser apparatus of (11), the metal thin layer covering the area in which the signal processing circuit unit and the bonding pad unit are formed may be connected to an external terminal so that a given voltage can be applied via the external terminal from outside the semiconductor laser apparatus.

(13) The above object is also fulfilled by an optical pickup apparatus having the semiconductor laser apparatus of (1). This enables the optical pickup apparatus to have advantageous effects provided by the semiconductor laser apparatus of (1).

(14) The above object is also fulfilled by a method for producing a semiconductor laser apparatus, the method comprising: a recess forming step for forming a recess in a semiconductor substrate by an anisotropic etching so that a side wall of the recess has a slant of substantially 45 degrees with respect to a main surface of the semiconductor substrate; a SiN layer forming step for, after the recess forming step, forming a SiN layer having a desired thickness on a bottom face of the recess by a plasma CVD method; a layer stacking step for, after the SiN layer forming step, forming a layer composed of Ti or TiW on an entire surface of the recess including the SiN layer and then forming a layer composed of Au or Pt on the layer composed of Ti or TiW, both by a sputtering method; a heat sink layer forming step for, after the layer stacking step, forming a heat sink layer composed of Au on the layer composed of Au or Pt, by plating; a covering step for, after the heat sink layer forming step, covering the heat sink layer with a layer that is composed of Ti or TiW and is thinner than the heat sink layer, and then covering the layer composed of Ti or TiW with a layer composed of Au or Pt, both by a sputtering method; and a bonding step for, after the covering step, bonding a semiconductor laser element with the layer composed of Au or Pt covering the heat sink layer, by soldering, wherein in the covering step, the layer composed of Au or Pt is formed to be thinner than the heat sink layer.

As stated above, in the semiconductor laser apparatus production method, a heat sink layer (Au) formed by plating is coated with a layer composed of Ti or TiW, and then with a layer composed of Au or Pt, the two layers being thinner than the heat sink layer, and then a semiconductor laser element is bonded with the layer composed of Au or Pt, by soldering. This arrangement prevents Sn in the solder from reacting with Au in the heat sink layer when the semiconductor laser element is bonded, thus enabling the semiconductor laser element to be mounted on the semiconductor substrate with high accuracy and reliability.

Accordingly, the production method of the present invention can produce a semiconductor laser apparatus that emits laser beams with high positional accuracy since the method enables the semiconductor laser element to be mounted on the semiconductor substrate with high accuracy and reliability.

When the semiconductor laser element is bonded, a diffusion may occur between the solder and the layer composed of Au or Pt. However, since the layer composed of Au or Pt is thinner than the heat sink layer, the positional accuracy of the semiconductor laser element is higher than the case where the heat sink layer is bonded directly with the solder layer.

It should be noted here that the slant of substantially 45 degrees indicates a slant of 45±5 degrees.

(15) The semiconductor laser apparatus production method of (14) may further comprise a second covering step for, between the covering step and the bonding step, covering the layer composed of Au or Pt with a layer composed of Al, and then covering the layer composed of Al with a dielectric layer.

This arrangement is preferable since it enables the surface of the optical reflector to have a reflection structure with high reflectance for laser beams (with a wavelength of approximately 400–600 nm).

(16) The semiconductor laser apparatus production method of (14) further comprise: a second covering step for, between the covering step and the bonding step, covering the layer composed of Au or Pt with a layer composed of Al, and then covering the layer composed of Al with a dielectric layer; and a removing step for removing the layer composed of Al and the dielectric layer except for an area covering side walls of the recess. This arrangement is preferable since it enables a side wall with a slant, namely the optical reflector, to have a reflection structure with high reflectance for blue light laser beams (having a wavelength of 400 nm to 600 nm). Accordingly, it is possible with this production method to produce a high-quality, low-cost semiconductor blue-light-laser apparatus.

(17) In the semiconductor laser apparatus production method of (14), prior to the layer stacking step, a photodetector element unit for receiving laser beams, a signal processing circuit unit for processing an electric signal generated by the photodetector element unit, and a bonding pad unit via which signals are input or output from or to outside the semiconductor laser apparatus have been formed in the semiconductor substrate at areas near the recess, in the layer stacking step, the layer composed of Ti or TiW is formed to further cover an area in which the signal processing circuit unit and the bonding pad unit have been formed, and then the layer composed of Au or Pt is formed on the layer composed of Ti or TiW covering the area, and in the covering step, another layer composed of Ti or TiW is formed on the layer composed of Au or Pt covering the area in which the signal processing circuit unit and the bonding pad unit have been formed, and then another layer composed of Au or Pt is formed on the layer composed of Ti or TiW covering the area.

This arrangement is preferable since it stabilizes the circuit operation, and contributes to forming an excellent ohmic characteristic when wire bonding is made. Also, the production method provides an advantageous effect of producing an apparatus that has an excellent resistance to corrosion.

BRIEF DESCRIPTION OF THE DRAWINGS

These and the other objects, advantages and features of the invention will become apparent from the following description thereof taken in conjunction with the accompanying drawings which illustrate a specific embodiment of the invention.

In the drawings.

DESCRIPTION OF THE PREFERRED EMBODIMENT

Embodiment 1

Construction of Optical Pickup Apparatus 1000

Figure 1:
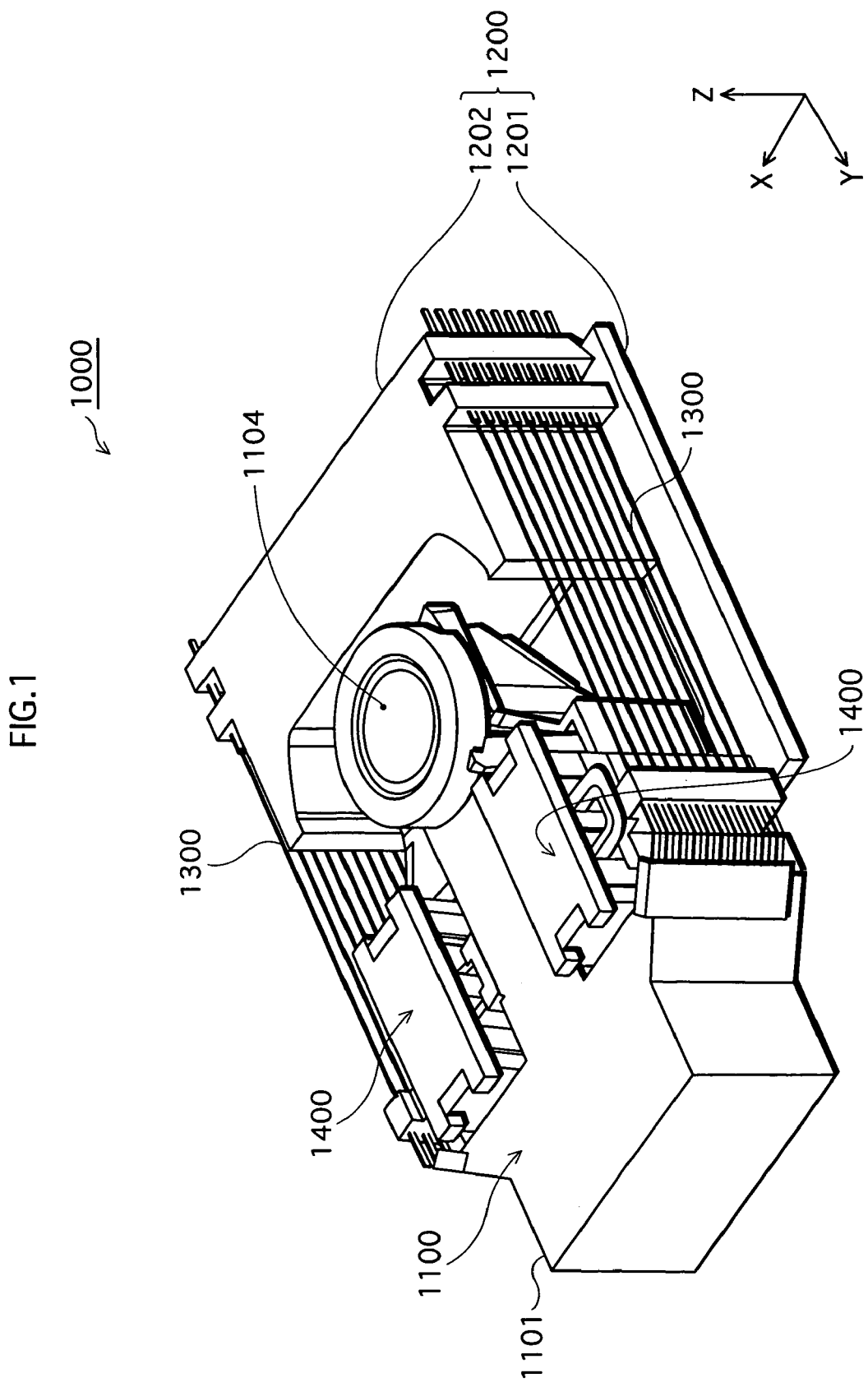
FIG. 1 is a perspective view of the optical pickup apparatus 1000 in the embodiments of the present invention.
Figure 2:
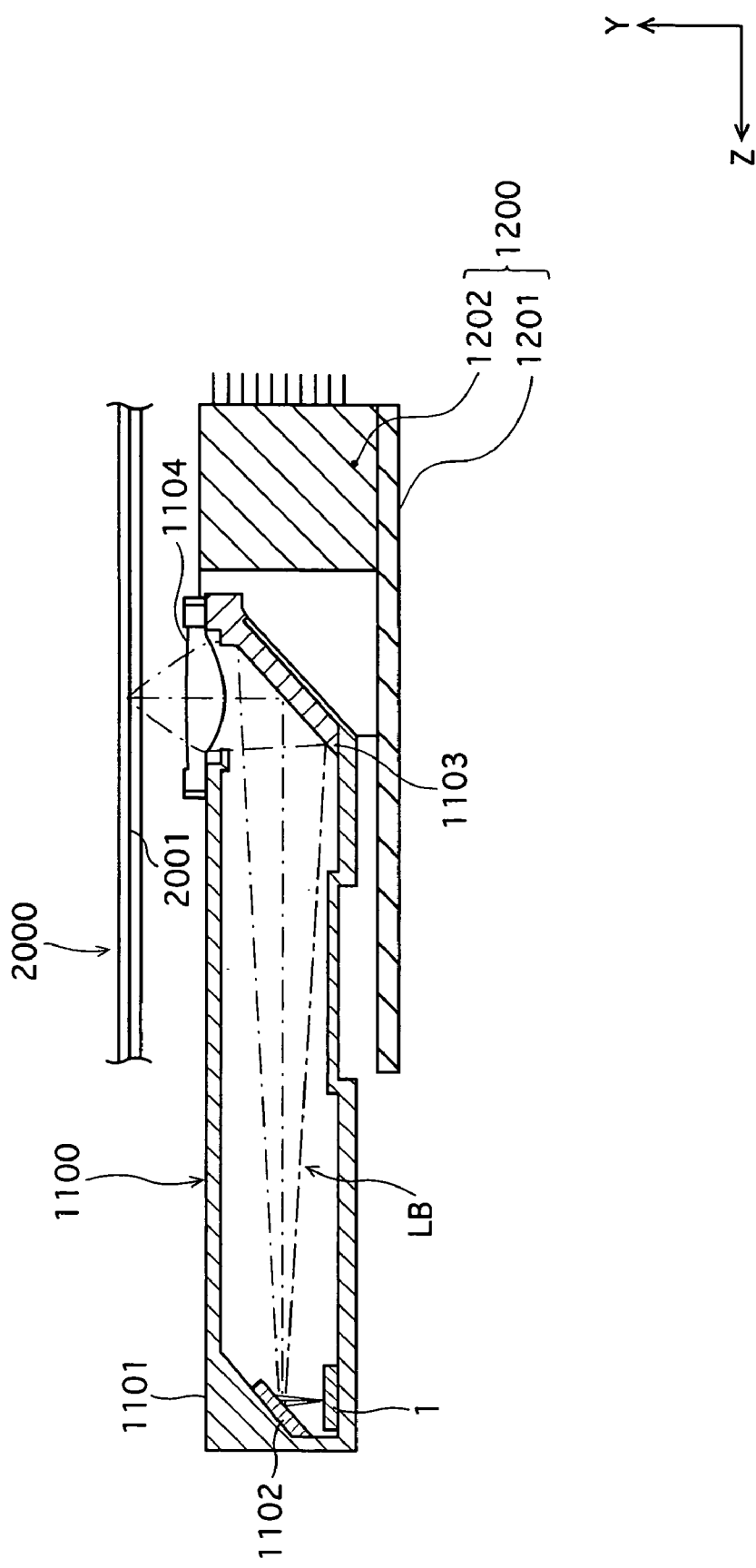
FIG. 2 is a sectional view of the optical pickup apparatus 1000.

First, the construction of an optical pickup apparatus 1000 will be described with reference to FIGS. 1 and 2. FIG. 1 is a perspective view of the optical pickup apparatus 1000. FIG. 2 is a sectional view of the optical pickup apparatus 1000. It should be noted here that in the following description, "focus direction" indicates, as direction Z in FIG. 1, a direction along an optical axis of an objective lens 1104 that will be described later, and "tracking direction" indicates, as direction X in FIG. 1, a direction perpendicular to a direction along the tracks of an optical recording medium such as CD or DVD that is the target of the recording/reproduction by the optical pickup apparatus 1000.

The optical pickup apparatus 1000 shown in FIG. 1 is what is called optical-system-integrated-driving-type. The optical pickup apparatus 1000 includes a movable unit 1100, a fixed unit 1200, and a suspension wire 1300 that connects the movable unit 1100 to the fixed unit 1200. The optical pickup apparatus 1000 also includes an actuator 1400 for displacing the movable unit 1100. The movable unit 1100 includes a case 1101 that is made of resin and contains an optical element (not illustrated in FIG. 1). The movable unit 1100 also includes an objective lens 1104 that is deposited on a surface of the case 1101 and is exposed to outside upward in the direction Z.

The fixed unit 1200 is composed of a base plate 1201 and a block unit 1202. The block unit 1202 is made of resin or the like and is fixed on the base plate 1201 that is substantially level.

As shown in FIG. 2, a semiconductor laser apparatus 1 is fixed inside the case 1101 of the movable unit 1100 at the bottom. Also, a hologram optical element 1102, a mirror 1103, and the objective lens 1104 are deposited in a light path between the semiconductor laser apparatus 1 and a recording surface 2001 of an optical recording medium 2000.

In the optical pickup apparatus 1000 having the above-described construction, a laser beam LB emitted from the semiconductor laser apparatus 1 is reflected by the hologram optical element 1102 and the mirror 1103, passes through the objective lens 1104 and is concentrated at a point on the recording surface 2001 of the optical recording medium 2000. The laser beam LB then reflects back from the recording surface 2001 traveling the same light path reversely. The returning laser beam LB is reflected and diffracted by the hologram optical element 1102 to be branched into a plurality of beams, and then the plurality of beams are concentrated at a photodetector element unit of the semiconductor laser apparatus 1.

The above-described construction enables the optical pickup apparatus 1000 to record information onto the optical recording medium 2000 such as a CD (Compact Disc) or a DVD (Digital Versatile Disc), or reproduce information recorded thereon.

Now, the semiconductor laser apparatus 1, which is one of the prime constituents of the optical pickup apparatus 1000, will be described in detail.

Construction of Semiconductor Laser Apparatus 1

The construction of the semiconductor laser apparatus 1 will be described with reference to FIGS. 3 and 4.

Figure 3:
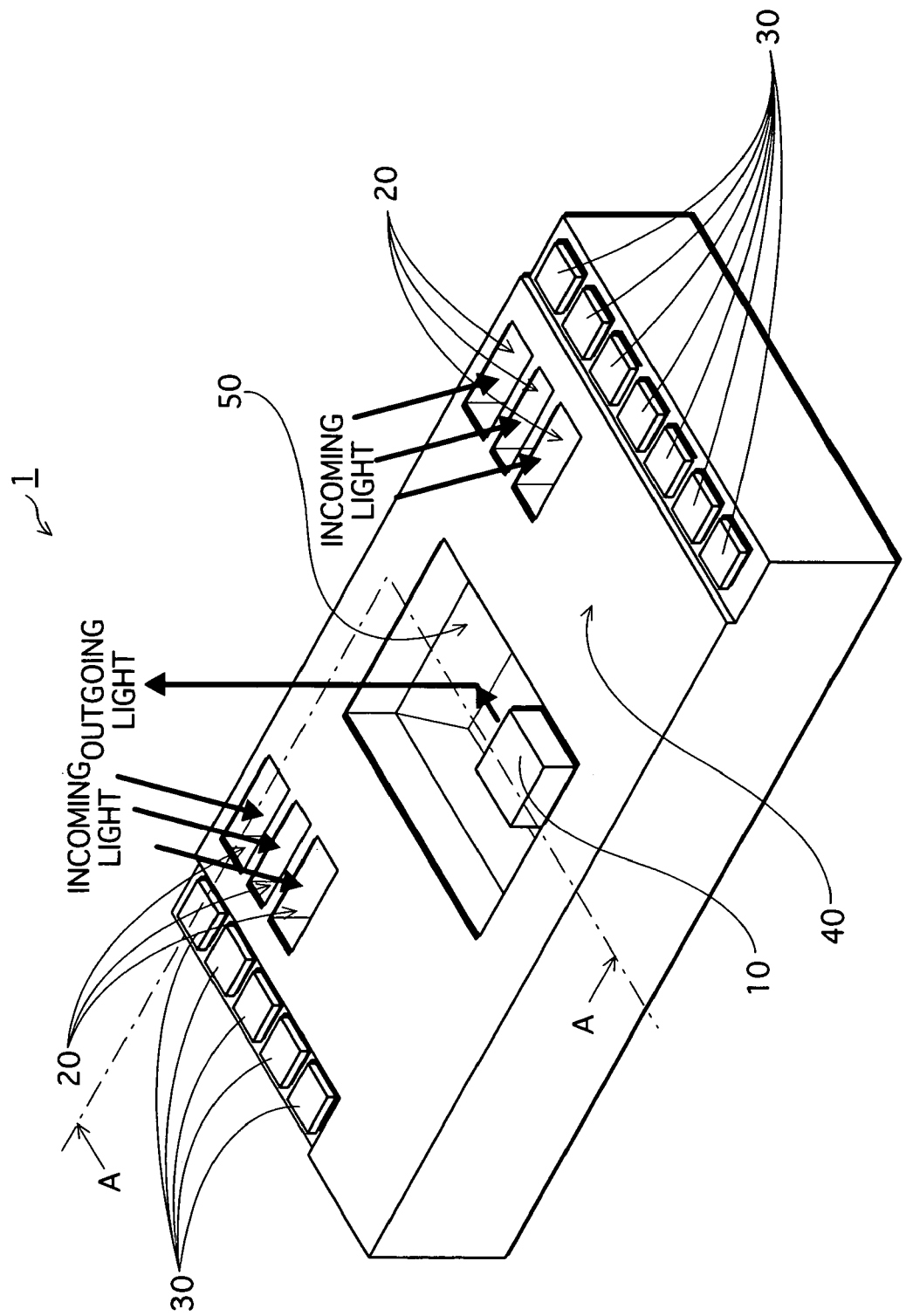
FIG. 3 is a perspective view of the semiconductor laser apparatus 1 of the optical pickup apparatus 1000.

As shown in FIG. 3, the semiconductor laser apparatus 1 includes a photodetector element unit 20, a bonding pad unit 30, a shading unit 40, a reflection unit 50, as well as a semiconductor laser element 10 that emits a laser beam LB. The semiconductor laser apparatus 1 also contains inside thereof a signal processing circuit unit 60 (not illustrated).

The semiconductor laser apparatus 1 is shaped like a box. The main surface of the semiconductor laser apparatus 1 has a recess at the center thereof, and the semiconductor laser element 10 is deposited on the bottom face of the recess. The lower part of the side walls of the recess constitutes the reflection unit 50, and has a 45±5-degree slant. The surface of the reflection unit 50 is covered with an Au layer. With this construction, the laser beam LB emitted from the semiconductor laser element 10 in a direction substantially parallel with the surface of a silicon substrate is reflected by the reflection unit 50, so that the laser beam LB goes out upwards from the apparatus as shown in FIG. 3.

FIG. 3 also shows six small recesses formed in the surface of the semiconductor laser apparatus 1, three recesses on each side of the recess at the center that contains the semiconductor laser element 10. The six recesses constitutes the photodetector element unit 20 that receives the laser beams LB that reflect back from the optical disc.

The reason why the photodetector element unit 20 is composed of six recesses, three recesses on each side of the semiconductor laser element 10, is that with this arrangement, it is possible for the signal processing circuit unit 60 (not illustrated in FIG. 3) to perform various calculations using the difference in the quality of light between laser beams that reflect back through the six recesses so as to detect a focus error, a tracking error or the like and to output a focus error signal, a tracking error signal or the like according to the detection.

The semiconductor laser apparatus 1 has 12 pads at the edge of the main surface thereof. The 12 pads constitute a bonding pad unit 30. The pads of the bonding pad unit 30 function as terminals for connecting the semiconductor laser apparatus 1 with external circuits.

The main surface of the semiconductor laser apparatus 1 is coated with the Au layer except for the areas in which the pads of the bonding pad unit 30 are formed. The Au layer constitutes the shading unit 40 that is formed to prevent the laser beams LB from affecting the inside of the apparatus.

The Au layer as the shading unit 40 also protects the apparatus against corrosion.

Now, the internal construction of the semiconductor laser apparatus 1 in the present embodiment will be described with reference to FIG. 4.

Figure 4:
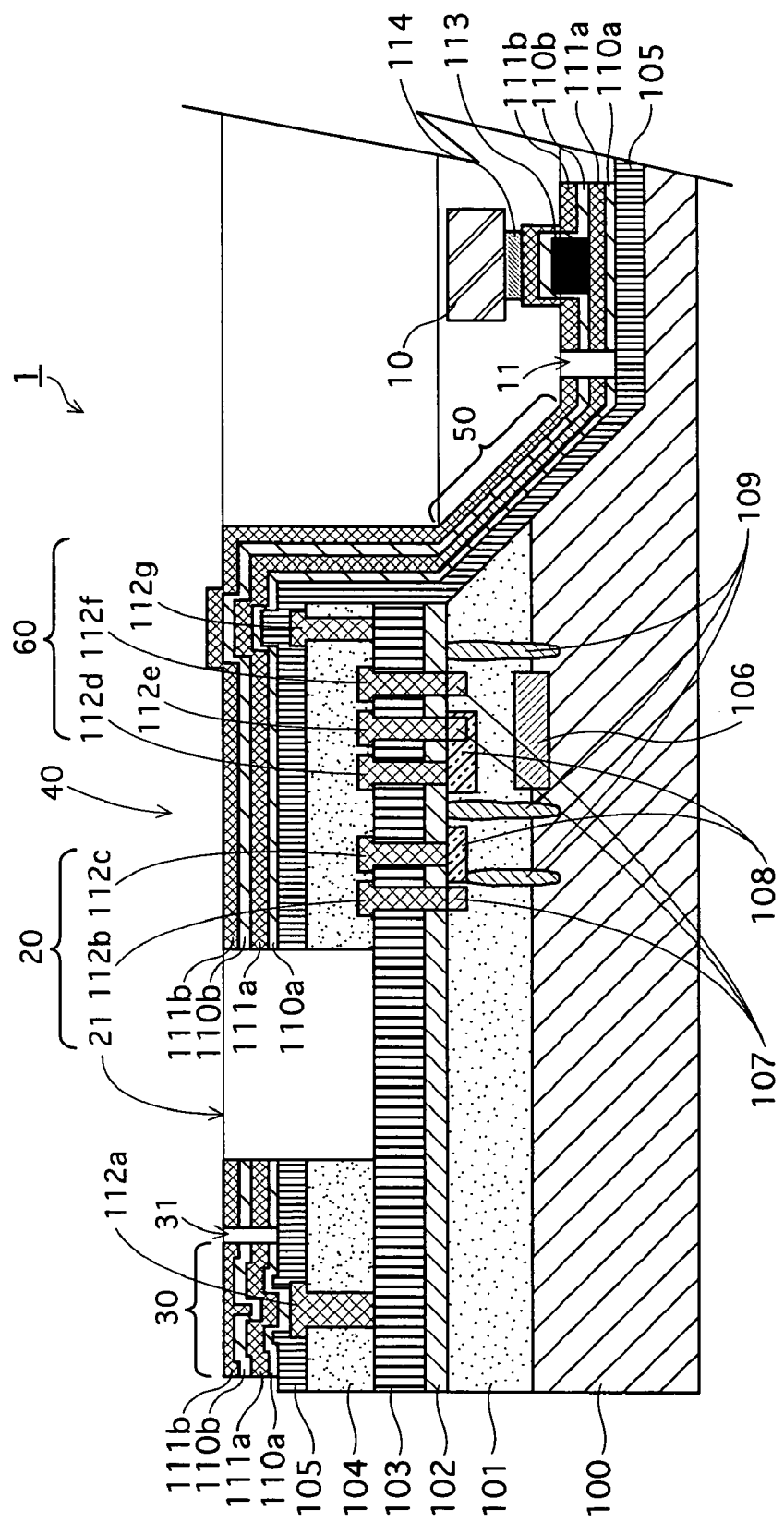
FIG. 4 is a sectional view of the semiconductor laser apparatus 1 taken substantially along the line A—A shown in FIG. 3.

FIG. 4 is a sectional view taken substantially along the line A—A shown in FIG. 3.

As shown in FIG. 4, the semiconductor laser apparatus 1 has a substrate composed of a p-type layer 100, ann-type epitaxial layer 101, a silicon thermal oxidation layer (hereinafter, referred to as $SiO_2$ layer) 102, a SiN layer 103, a boron-phosphorus-added $SiO_2$ (hereinafter referred to as BPSG) layer 104 that functions as an interlayer insulating layer, and a SiN layer 105, the layers formed in the stated order from bottom.

On the right-hand side of FIG. 4, a recess 115 is shown. The semiconductor laser element 10 is attached onto the bottom face of the recess 115. The bottom of the recess 115 is composed of the p-type layer 100 and the SiN layer 105 formed thereon, without the n-type epitaxial layer 101, $SiO_2$ layer 102, SiN layer 103, and BPSG layer 104.

On the left-hand side of FIG. 4, a recess 21 is shown. The SiN layer 103, as the bottom of the recess 21, is exposed to outside the apparatus. The photodetector element unit 20 receives the laser beams LB at the exposed SiN layer 103.

On the SiN layer 105, except for certain areas thereof, a Ti layer 110*a*, an Au layer 111*a*, a Ti layer 110*b*, and an Au layer 111*b* are formed as a stack in the stated order. The Ti layers 110*a* and 110*b* are respectively 0.2 μm thick, and the Au layers 111*a* and 111*b* are respectively 0.4 μm thick.

The Ti layer 110*a*, Au layer 111*a*, Ti layer 110*b*, and Au layer 111*b* cover the entire surface of the apparatus, except for the areas cut by the recess 21 and recesses 11 and 31.

At a position between the recess 21 and the recess 115, an n-type diffused layer 106 is formed between the p-type layer 100 and the n-type epitaxial layer 101. The n-type diffused layer 106 penetrates into both the p-type layer 100 and the n-type epitaxial layer 101.

Three n-type diffused layers 107 and two p-type diffused layers 108 are formed in the surface of the n-type epitaxial layer 101 facing the $SiO_2$ layer 102.

Also, three isolation layers 109, which are formed by embedding polysilicon or the like, pass through the n-type epitaxial layer 101 to connect the boundary between the n-type epitaxial layer 101 and the $SiO_2$ layer 102 to the p-type layer 100.

It should be noted here that these layers are known and formed using known technologies, and therefore a detailed description of these layers is omitted.

Although not illustrated in FIG. 4, an Al wiring layer having a desired pattern is formed on both top and bottom surfaces of the BPSG layer 104, and through holes 112*a* and 112*g* are formed to connect the two Al wiring layers with each other.

Also, through holes 112*b*, 112*c*, 112*d*, 112*e*, and 112*f* are formed to connect the Al wiring layer formed on the bottom surface of the BPSG layer 104 with the n-type diffused layers 107 and the p-type diffused layers 108. The through holes 112*a* to 112*g* are formed by opening holes by etching, and filling the holes with a material such as W.

As shown on the left-hand side of FIG. 4, the SiN layer 105 of the bonding pad unit 30 has an opening at a position on the through hole 112*a*, so that the through hole 112*a* is connected to the Ti layer 110*a*. With this construction, the bonding pad unit 30 enables certain portions of the Al wiring layer on top surface of the BPSG layer 104 to connect to outside for input/output of signals or electric power. Also, since a stack of the Ti layers 110*a* and 110*b* and the Au layers 111*a* and 111*b* is isolated, demarcating the pads of the bonding pad unit 30, the pads of the bonding pad unit 30 are electrically isolated from each other, and the bonding pad unit 30 is electrically isolated from the shading unit 40.

The photodetector element unit 20 is composed of a recess 21 and through holes 112*b* and 112*c*. The recess 21 receives the laser beams LB that reflect back from the optical disc. The through holes 112*b* and 112*c* are electrodes that transfer electric signals, that are converted from the laser beams the recess 21 receives, to the signal processing circuit unit 60.

Also, as shown in FIG. 4, on the right-hand side of the photodetector element unit 20, the signal processing circuit unit 60 is formed. The signal processing circuit unit 60 is composed of two Al wiring layers (not illustrated), the n-type epitaxial layer 101, n-type diffused layers 107, p-type diffused layers 108, and through holes 112*d* to 112*g*. The signal processing circuit unit 60 performs calculations based on the electric signals received from the six recesses constituting the photodetector element unit 20, and outputs a signal (for example, a focus error signal or a tracking error signal) in accordance with the result of the calculations.

As shown in FIG. 4 on the right-hand side, the recess 115 has side walls whose upper part is vertical and lower part has a 45±15-degree slant with respect to the surface of the silicon substrate. Of the side walls of the recess 115, one side wall (a side wall on the left-hand side in FIG. 4) has a stack of the Ti layers 110*a* and 110*b* and the Au layers 111*a* and 111*b*. Especially, the lower part of the side wall shaving a 45±15-degree slant, whose surface is composed of the Au layer 111*b*, functions as the reflection unit 50 for reflecting the laser beams LB emitted from the semiconductor laser element 10 upward.

The semiconductor laser element 10 is deposited and soldered onto a projection in the bottom face of the recess 115. Between the semiconductor laser element 10 and the SiN layer 105 that is on the p-type layer 100, there are a heat sink layer 113 and a solder layer 114 (being, for example, 0.4 μm thick), as well as the Ti layers 110*a* and 110*b* and the Au layers 111*a* and 111*b*.

The heat sink layer 113 is inserted between the Au layer 111*a* and the Ti layer 110*b*, and is approximately 20 μm thick. As understood from this, the heat sink layer 113 is thicker than the Au layers 111*a* and 111*b* (being, for example, 0.4 μm thick). This is because with this arrangement, it is possible to secure the accuracy of a position in the substrate-thickness direction at which the semiconductor laser element 10 is attached to the apparatus. Here, the heat sink layer 113 has a function of letting heat, which is generated as the semiconductor laser element operates, escape. The heat sink layer 113 also functions as an electrode on one side of the semiconductor laser element 10 and also functions as a base above which the semiconductor laser element 10 is placed and by which the position of the semiconductor laser element 10 in the substrate-thickness direction is adjusted.

The semiconductor laser element 10 is electrically isolated from the reflection unit 50 at the bottom face of the recess 115 since a stack of the Ti layers 110a and 110b and the Au layers 111a and 111b is isolated by a recess 11 between the semiconductor laser element 10 and the reflection unit 50.

Advantageous Effects of Semiconductor Laser Apparatus 1

In the above-described semiconductor laser apparatus 1 of the present embodiment, the photodetector element unit 20 and the semiconductor laser element 10 are mounted on a same substrate. This contributes to downsizing of the apparatus. With this construction, the semiconductor laser apparatus 1 can reduce the gap between the photodetector element unit 20 and the semiconductor laser element 10 that emits the laser beam LB. This enables the light path of the laser beam LB to be designed efficiently, and simplifies the alignment adjustment of each optical element deposited between the semiconductor laser apparatus 1 and the optical disc.

Also, the stack of the Ti layers 110a and 110b and the Au layers 111a and 111b formed directly on the through hole 112a of the bonding pad unit 30 provides an excellent ohmic formation during the wire bonding process in the assembly.

The surfaces of the shading unit 40 and the reflection unit 50 are both made of the Au layer 111b. As a result, these units can be formed in a same process, resulting in the production cost reduction.

The major characteristic of the present embodiment lies in the manner in which the semiconductor laser element 10 is mounted on the substrate. The following will describe the advantageous effects provided by the mounting method.

In general, the semiconductor laser element 10 is mounted to enable a laser beam LB to be emitted from its side. For this reason, the present embodiment forms the recess 115 as shown in FIGS. 3 and 4 in advance, and then mounts the semiconductor laser element 10 on bottom face of the recess 115.

The height of the semiconductor laser element 10 from the bottom face of the recess 115 is the most important factor in defining the position at which the laser beam Lb is emitted from the apparatus. As a result, to secure the accuracy of a position in the substrate-thickness direction, the present embodiment inserts the heat sink layer 113, which provides a positional adjustment function, between layers constituting a stack under the semiconductor laser element 10, then solders the semiconductor laser element 10 onto the stack, so that the solder layer 114 bonds the semiconductor laser element 10 to the substrate.

Here, suppose the semiconductor laser element 10 is directly soldered onto the heat sink layer 113, then a chemical reaction would occur between Au element in the heat sink layer 113 and Sn element in the solder layer 114, and the distance between the semiconductor laser element 10 and the bottom face of the recess 115 would be deviated from the distance defined in the design.

In contrast, in the semiconductor laser apparatus 1 in the present embodiment, the stack of the Ti layers 110a and 110b and the Au layers 111a and 111b that is present between the solder layer 114 and the heat sink layer 113 prevents the chemical reaction from occurring between Au element in the heat sink layer 113 and Sn element in the solder layer 114, limiting the variation in the distance between the semiconductor laser element 10 and the bottom face of the recess to a very minute value. The Au layer 111b (being, for example, 0.4 μm thick), which is directly connected to the solder layer 114, is far thinner than the heat sink layer 113 that is approximately 20 μm thick. As a result, even if the position of the semiconductor laser element 10 is deviated from a designed value due to the reaction between Au element in the Au layer 111b and Sn element in the solder layer 114, the variation is expected to be very small. In the semiconductor laser apparatus 1, the Ti layer 110b between the Au layer 111b and the heat sink layer 113 functions as a diffusion preventing layer for preventing a diffusion from occurring between the Au layer 111b and the heat sink layer 113. With this construction, it is possible to mount the semiconductor laser element 10 with great precision, and allows the semiconductor laser element 10 to emit the laser beam LB with high positional precision.

In the semiconductor laser apparatus 1 of the present embodiment, the semiconductor laser element 10 is deposited in the recess 115. This prevents the heat, which is generated as the semiconductor laser element 10 is operated, from being transferred via the surface of the semiconductor substrate to the signal processing circuit unit 60 and providing an adverse effect on it. This construction is thus excellent from the viewpoint of stabilizing the operation of the signal processing circuit unit 60.

In the semiconductor laser apparatus 1 in the present embodiment, it is preferable that the reflection unit 50 is grounded. This is because it prevents the charge-up of the reflection unit 50 by carriers that are generated by radiation of the laser beams, protecting the signal processing circuit unit 60 or the like formed in the substrate from the possible damages caused by the charge-up.

The semiconductor laser apparatus 1 may be connected to an external terminal so that a given voltage can be applied to the shading unit 40 through the external terminal. With this performance, the dark current that is generated at the photodetector element unit 20 by the circuit operation of the signal processing circuit unit 60 can be suppressed. For example, an application of a given voltage to the shading unit 40 can cancel the influence on the electric field around the photodetector element unit 20 exerted by the fixed electric charge generated by the circuit operation. This effect is enhanced especially when, as is the case with the present embodiment, a metal thin film at the outermost surface is made of Au or Pt since it prevents variation of bias by corrosion or oxidation.

Production Method of Semiconductor Laser Apparatus 1

The production method of the semiconductor laser apparatus 1 will be described with reference to FIGS. 5–8. FIGS. 5–8 respectively show processes of mounting the semiconductor laser element 10, one of the major constituent of the semiconductor laser apparatus 1.

Figure 5A:
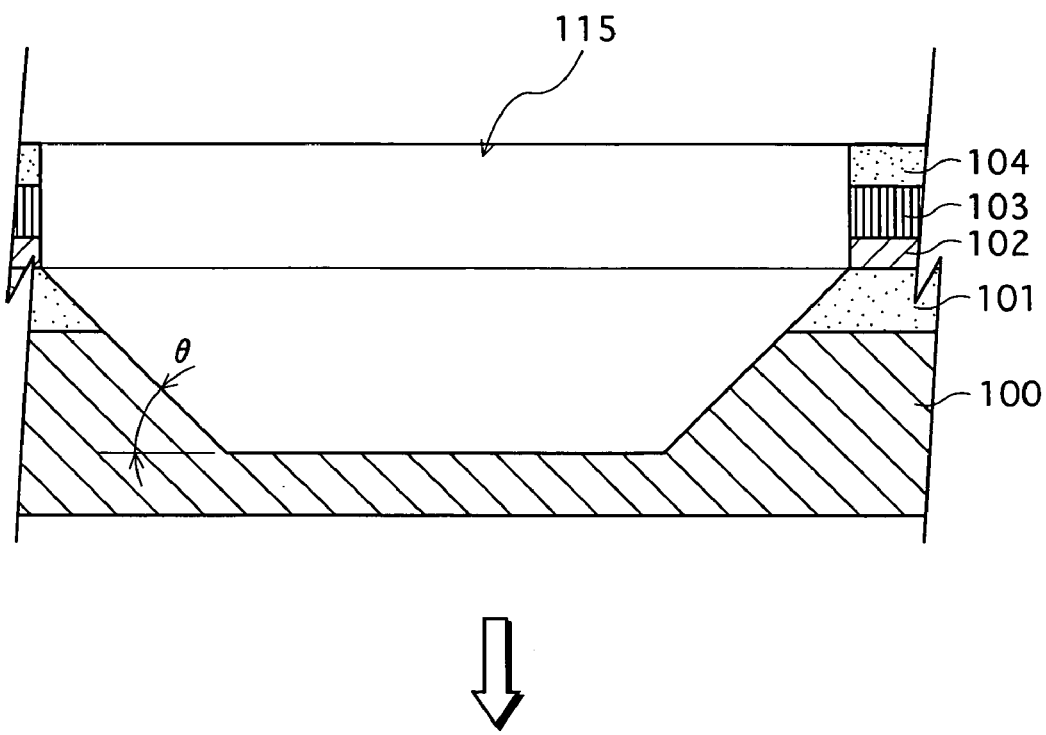
FIG. 5A is a sectional view of the semiconductor laser apparatus 1 in process when the recess 115 has been formed.

As shown in FIG. 5A, the n-type epitaxial layer 101, $SiO_2$ layer 102, SiN layer 103, BPSG layer 104, and SiN layer 105 are formed one by one on the p-type layer 100 in the stated order. The $SiO_2$ layer 102 is then exposed to outside by the KOH etching. The $SiO_2$ layer 102 is opened partially. Then a recess, whose side walls have a slant of θ (45±5 degrees) with respect to the surface of the apparatus, is made by the Si anisotropic etching using the $Sio_2$ layer 102 as a mask. In this way, the recess 115 whose lower side walls have a 45±5-degree slant is formed.

The p-type layer 100 is made of a substrate having a (100) crystal face orientation whose crystal axis is tilted by 9.7 degrees, and the substrate portions having a (111) crystal face orientation are worked to form the side walls having a 45±5-degree slant as the reflection unit 50 of the semiconductor laser apparatus 1.

An aqueous solution containing 20% KOH by weight is used in the Si anisotropic etching. The etching depth of the p-type layer 100 is approximately 40 µm.

Figure 5B:
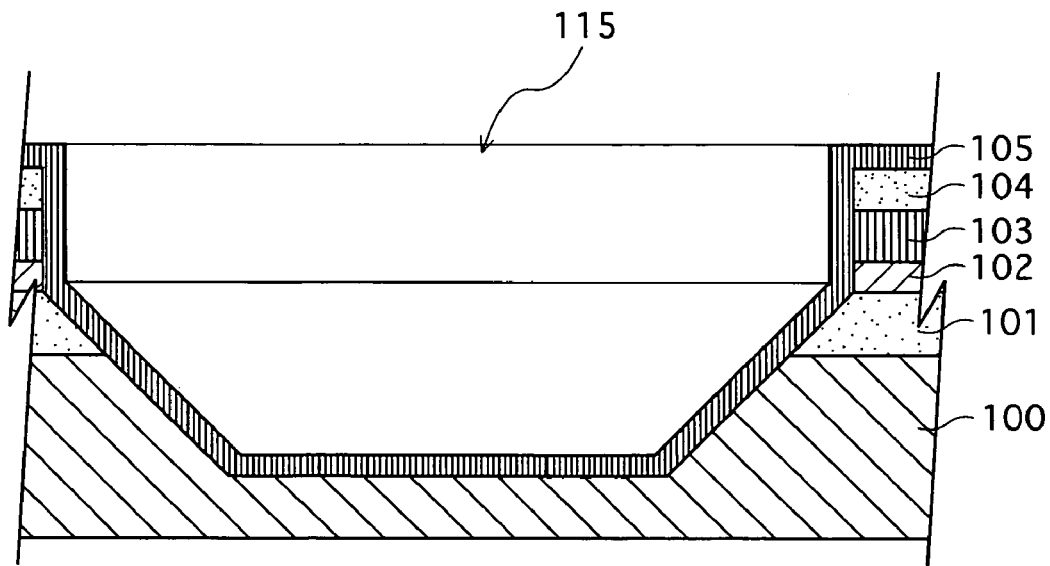
FIG. 5B is a sectional view of the semiconductor laser apparatus 1 in process when the SiN layer 105 has been formed.

Next, as shown in FIG. 5B, the SiN layer 105 is formed by a deposition method to cover the entire surface of the substrate including the inner walls of the recess 115.

Figure 6A:
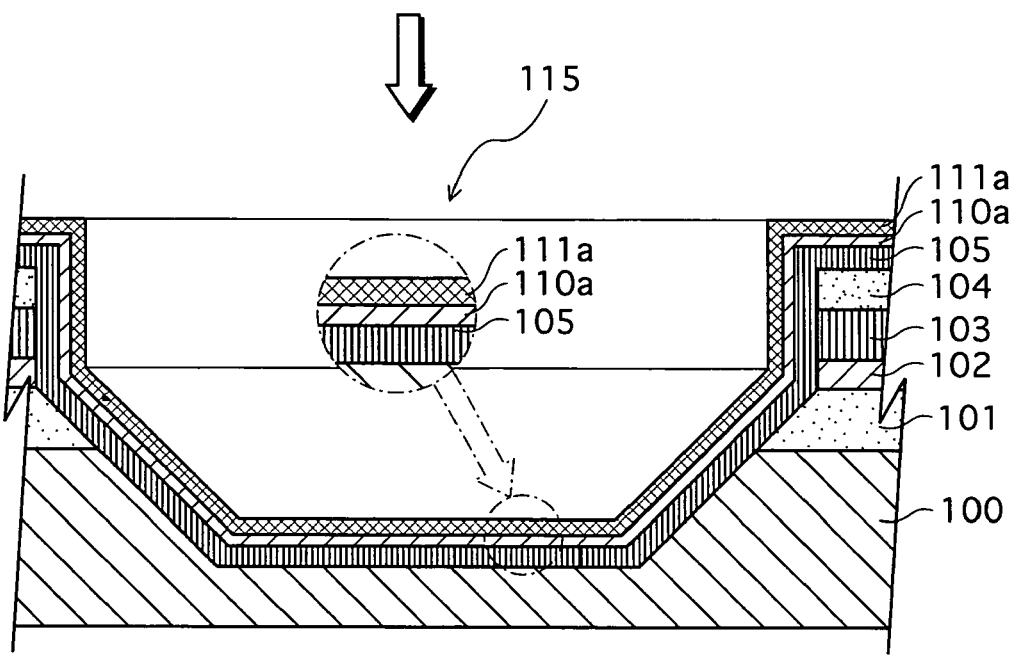
FIG. 6A is a sectional view of the semiconductor laser apparatus 1 in process when the Ti layer 110a and the Au layer 111a have been formed.

Next, as shown in FIG. 6A, the Ti layer 110a and the Au layer 111a are formed on the SiN layer 105 in the stated order by the sputtering method. As described earlier, the Ti layer 110a is 0.2 µm thick, and the Au layer 111a is 0.4 µm thick.

It should be noted here that although not illustrated, the SiN layer 105 is partly removed from an area directly on top of the through hole 112a in the bonding pad unit 30 before the Ti layer 111a and the Au layer 111a are formed.

Figure 6B:
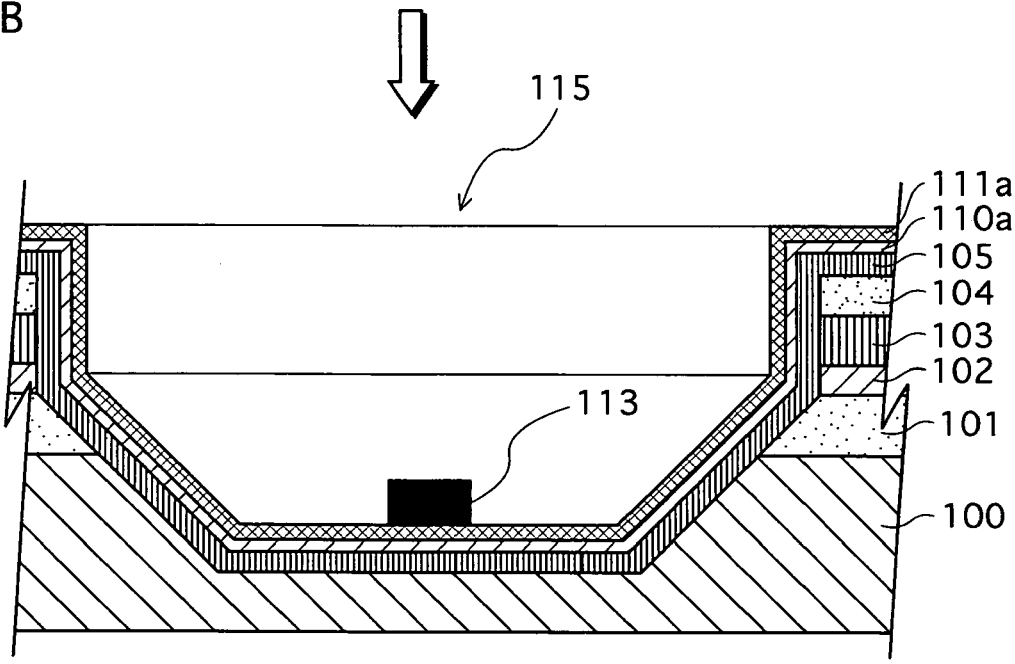
FIG. 6B is a sectional view of the semiconductor laser apparatus 1 in process when the heat sink layer 113 has been formed on the bottom face of the recess 115.

In the next step, as shown in FIG. 6B, the heat sink layer 113 that functions as a base is formed by wet etching on the Au layer 111a at the bottom of the recess 115. The thickness of the heat sink layer 113 is equivalent to a difference between the desired position of the semiconductor laser element 10 for emitting the laser beams and a position of the semiconductor laser element 10 when placed at the bottom of the recess 115 in the substrate-thickness direction. The central value of the thickness of the heat sink layer 113 is, for example, 20 µm. It should be noted here that this value varies depending on the depth of the recess 115 or the length of the light path between the semiconductor apparatus 1 and the optical disc.

In FIG. 6B, it does not appear that the heat sink layer 113 is connected to some entity, but actually, the heat sink layer 113 extends to outside the recess 115 averting the reflection unit 50 so that the heat sink layer 113 can be connected to a desired wiring. For this reason, the heat sink layer 113 may be divided into two parts as a connection to wiring and as the base, and the two parts may be formed by wet etching one by one.

Figure 7A:
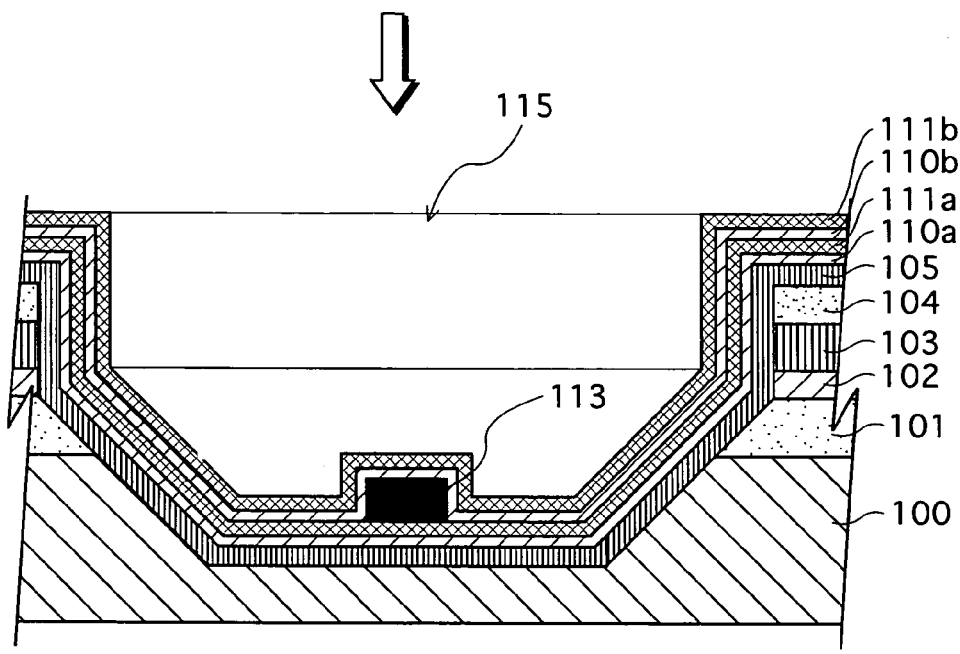
FIG. 7A is a sectional view of the semiconductor laser apparatus 1 in process when the Ti layer 110b and the Au layer 111b have been formed.

Next, as shown in FIG. 7A, the Ti layer 110b and the Au layer 111b are formed on the SiN layer 105 on which the heat sink layer 113 has been formed at the bottom of the recess 115, in the same manner as shown in FIG. 6A. The Ti layer 110b is 0.2 µm thick, and the Au layer 111b is 0.4 µm thick, as is the case with the Ti layer 111a and the Au layer 111a.

Figure 7B:
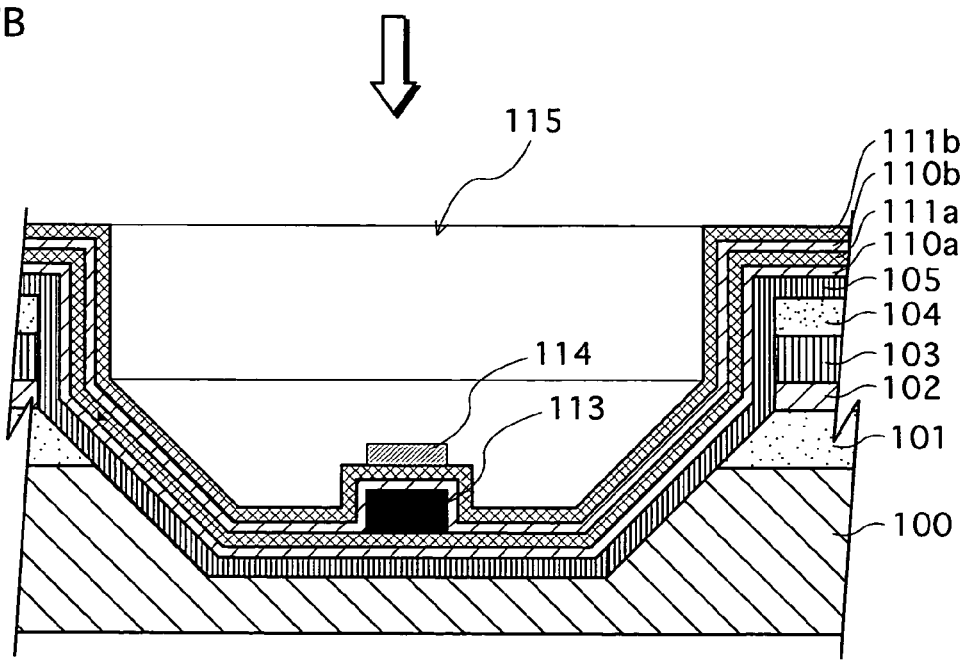
FIG. 7B is a sectional view of the semiconductor laser apparatus 1 in process when the solder layer 114 has been formed.

Then, as shown in FIG. 7B, the solder layer 114 is formed by plating on a surface of the Au layer 111b stacked on the heat sink layer 113. The solder layer 114 is 0.4 µm thick.

Figure 8A:
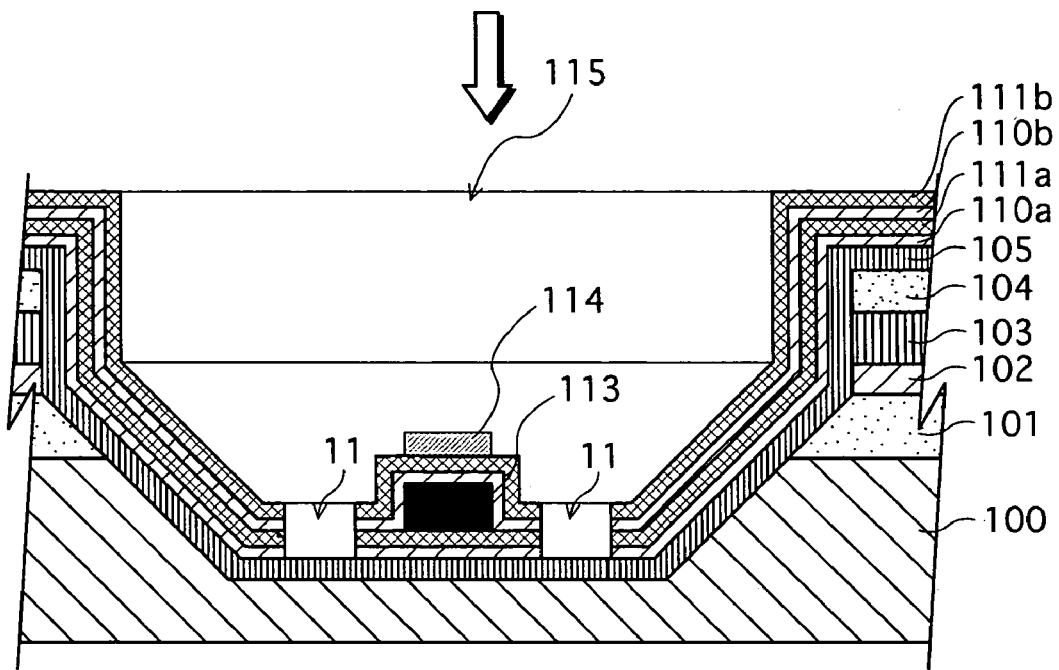
FIG. 8A is a sectional view of the semiconductor laser apparatus 1 in process when the recess 11 has been formed.

Then, as shown in FIG. 8A, the Ti layer 110a, the Au layer 111a, the Ti layer 110b, and the Au layer 111b are partially removed, by photolithography, from an area surrounding the heat sink layer 113 to form the recess 11. It should be noted here that an extension (not illustrated) of the heat sink layer 113 for connection is retained, not removed.

It should be noted here that although not illustrated, the recess 31 and the recess unit 20 are formed, like the recess 11, by removing the Ti layer 110a, the Au layer 111a, the Ti layer 110b, and the Au layer 111b.

Figure 8B:
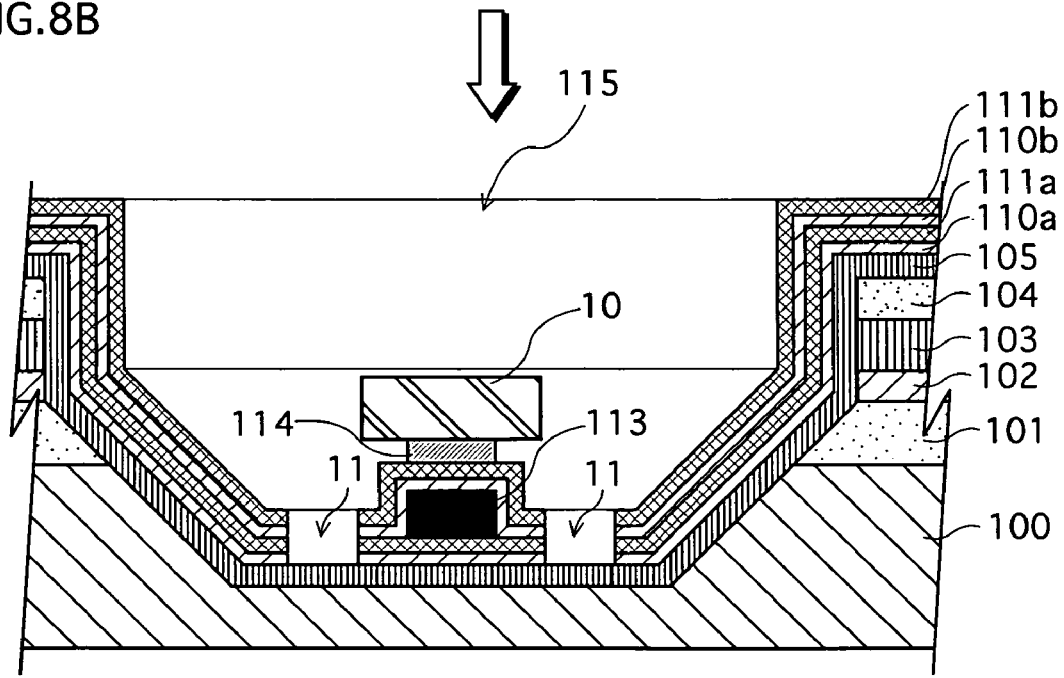
FIG. 8B is a sectional view of the semiconductor laser apparatus 1 in process when the semiconductor laser element 1 has been bonded with the solder layer 114.

Lastly, as shown in FIG. 8B, the semiconductor laser element 10 having been manufactured in advance is placed on and bonded with the solder layer 114. This completes the semiconductor laser apparatus 1.

The above-described production method prevents Au element in the heat sink layer 113 from diffusing into the solder layer 114 and prevents Sn element in the solder layer 114 from diffusing into the heat sink layer 113 by preventing reaction between these elements. This makes it possible for the semiconductor laser element 10 to be bonded at a desired position with great precision. This is because the Ti layer 110b inserted between the heat sink layer 113 and the solder layer 114 functions as a diffusion preventing layer. Although a diffusion may occur between the Au layer 111b and the solder layer 114, the measurement accuracy is increased substantially since the Au layer 111b (0.4 µm thick) is far thinner than the heat sink layer 113 (20 µm thick)

The above description of the manufacturing process including the Ti layers 110a and 110b and the Au layers 111a and 111b referring to FIGS. 5–8 is focused on an area where the semiconductor laser element 10 is mounted. In actuality, however, the Ti layers 110a and 110b and the Au layers 111a and 111b also cover the bonding pad unit 30, shading unit 40, and reflection unit 50 of the semiconductor laser apparatus 1. That is to say, these layers can be formed in the same process. This is advantageous in regards with the production cost.

The production method of the present semiconductor laser apparatus is not limited to the process shown in FIGS. 5–8 in so far as the method includes insertion of a diffusion preventing layer between the heat sink layer 113 and the solder layer 114 to prevent a diffusion from occurring between the heat sink layer 113 and the solder layer 114 by preventing reaction between Au and Sn elements in the layers.

In the above description, the Ti layers 110a and 110b and the Au layers 111a and 111b are inserted between the heat sink layer 113 and the solder layer 114. However, the same effects can be obtained if Ti is replaced with TiW or Mo, or if Au is replaced with Pt.

Also, the methods used in the processes are not limited to those adopted in the above description. For example, the Ti layers 110a and 110b and the Au layers 111a and 111b may be formed by a vacuum vapor deposition such as a chemical vapor deposition, other than the sputtering method.

Embodiment 2

A semiconductor laser apparatus 2 in the optical pickup apparatus of Embodiment 2 will be described with reference to FIGS. 9 and 10.

The construction of the semiconductor laser apparatus 2 is basically the same as that of the semiconductor laser apparatus 1 in Embodiment 1, except for how to lead an electrode of the semiconductor laser element 10. In the following description, only differences from Embodiment 1 will be described, where the components common to these embodiments are identified by the same reference numbers.

Figure 9:
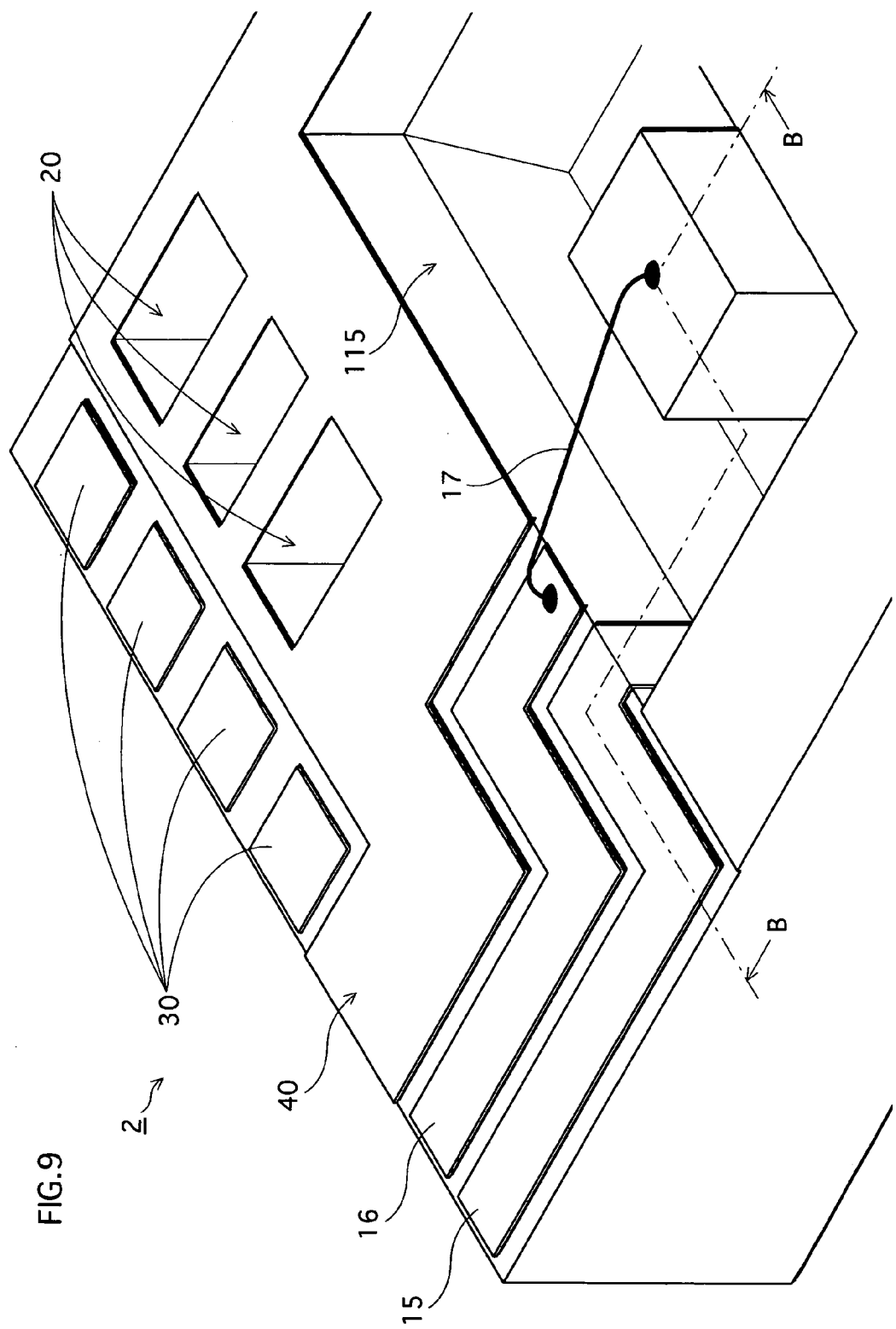
FIG. 9 is a partial perspective view of the semiconductor laser apparatus 2 of the optical pickup apparatus in Embodiment 2 of the present invention.

As shown in FIG. 9, two electrodes 15 and 16 are formed spreading between an edge of the recess 115 and an edge of the apparatus.

Although not illustrated, the electrodes 15 and 16 are composed of the Ti layer 110a, Au layers 111a, heat sink layer 113, Ti layer 110b, and Au layer 111b which are formed on the SiN layer 105. The electrode 16 is electrically isolated, at the edge of the recess 115, from the heat sink layer 113 and the like to which the semiconductor laser element 110 is connected.

The electrode 16 is connected to an electrode on an upper side of the semiconductor laser element 10 via a wire bonding 17.

The electrode 15 extends from under the heat sink layer 113 to the edge of the substrate along the side wall of the recess 115. The structure will be described in more detail with reference to FIG. 10. FIG. 10 is a sectional view taken substantially along the line B—B shown in FIG. 9.

Figure 10:
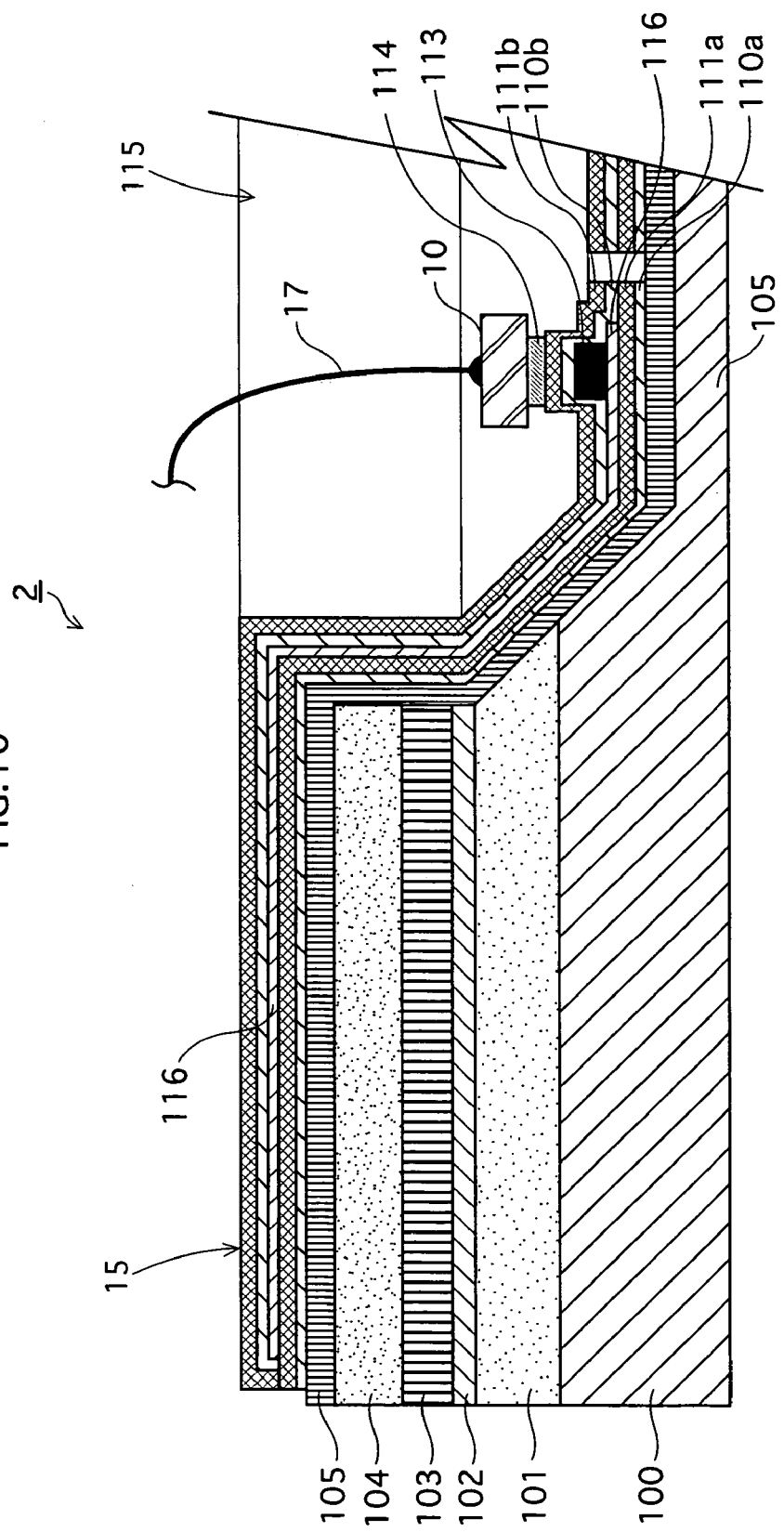
FIG. 10 is a sectional view of the semiconductor laser apparatus 2 taken substantially along the line B—B shown in FIG. 9.

As shown in FIG. 10, in the semiconductor laser apparatus 2, an Au leader electrode 116 is inserted between the heat sink layer 113 and the Au layer 111a. The Au leader electrode 116 is formed by wet etching to extend to the edge of the substrate along the side wall of the recess 115.

In the semiconductor laser apparatus 2 having the above-described construction in which the electrodes 15 and 16 are formed in the above-described manner, the semiconductor laser element 10 can be connected to an external circuit by bonding at the edge of the substrate. This, compared with the case where the semiconductor laser element 10 is directly connected to an external circuit by bonding, protects the apparatus from an excess stress.

As a result, the semiconductor laser apparatus 2 provides the following advantageous effect, as well as the advantageous effects provided by the semiconductor laser apparatus 1 in Embodiment 1. That is to say, if the semiconductor laser apparatus 2 receives a force from outside, the wire bonding to the semiconductor laser element 10 is resistant to cut.

Supplements to Embodiments

In Embodiments 1 and 2, the characteristics and advantageous effects of the present invention have been explained using a semiconductor laser apparatus for use in an optical pickup apparatus as an example. However, the present invention is not limited to a semiconductor laser apparatus for use in an optical pickup apparatus, but may be applied to a semiconductor laser apparatus having a combination of a semiconductor laser element and a reflection unit.

The present invention is not limited to Embodiments 1 and 2 in so far as the Ti layer 110b inserted between the heat sink layer 113 and the solder layer 114 functions as a diffusion preventing layer for preventing diffusion of Au and Sn. For example, in Embodiments 1 and 2, the Ti layers 110a and 110b are formed as the diffusion preventing layer. However, the material of the diffusion preventing layer is not limited to Ti in so far as the material has an ohmic characteristic electrically and does not form an alloy phase by reacting with the heat sink layer 113 or the solder layer 114. For example, at least one selected from a group consisting of Ti, W, and Mo may be used as the material of the diffusion preventing layer.

Also, the Au layer may be replaced with a Pt layer.

Also, the present invention is not limited to the two-layer structure disclosed in Embodiments 1 and 2. For example, the present invention can be applied to a three-layer structure.

When only the Ti layer 110b is inserted between the heat sink layer 113 and the solder layer 114, the undulations of the surface become high due to a difference in the layer thickness, which makes it difficult to secure the positional accuracy of the semiconductor laser element 10. This also applies to the case where only the Au layer 111b is inserted between these layers. As a result, it is preferable that two or more layers are inserted between the heat sink layer 113 and the solder layer 114.

In Embodiments 1 and 2, the photodetector element unit 20 includes six recesses. However, the photodetector element unit 20 is not limited to this construction.

Embodiment 3

A semiconductor laser apparatus 3 in the optical pickup apparatus of Embodiment 3 will be described with reference to FIGS. 11 and 12.

The construction of the semiconductor laser apparatus 3 is basically the same as that of the semiconductor laser apparatus 1 in Embodiment 1, except for the construction of the reflection unit 50. In the following description, only differences from Embodiment 1 will be described, where the components common to these embodiments are identified by the same reference numbers.

In Embodiment 1, the reflection layer of the reflection unit is composed of the Au layer 111b, Ti layer 110b, Au layer 111a, and Ti layer 110a in the stated order from the surface. In the present embodiment, as shown in FIG. 11, the Au layer 111b of the reflection unit is covered with an Al layer 116 and a dielectric layer 117. It is preferable that the dielectric layer 117 is made of a material that has a refractive index (n) of approximately 1.3 to 1.5. Although it is possible to use $SiO_x$ ($x \leq 2$) or $MgF_2$ as the material of the dielectric layer 117, it is preferable from the viewpoint of the workability and stability that the dielectric layer 117 is made of $SiO_x$.

The dielectric layer 117 may also be made of $Al_2O_3$, $AlF_3$, $CaF_2$, $LiF$, $CeO_2$ or the like.

Figure 11:
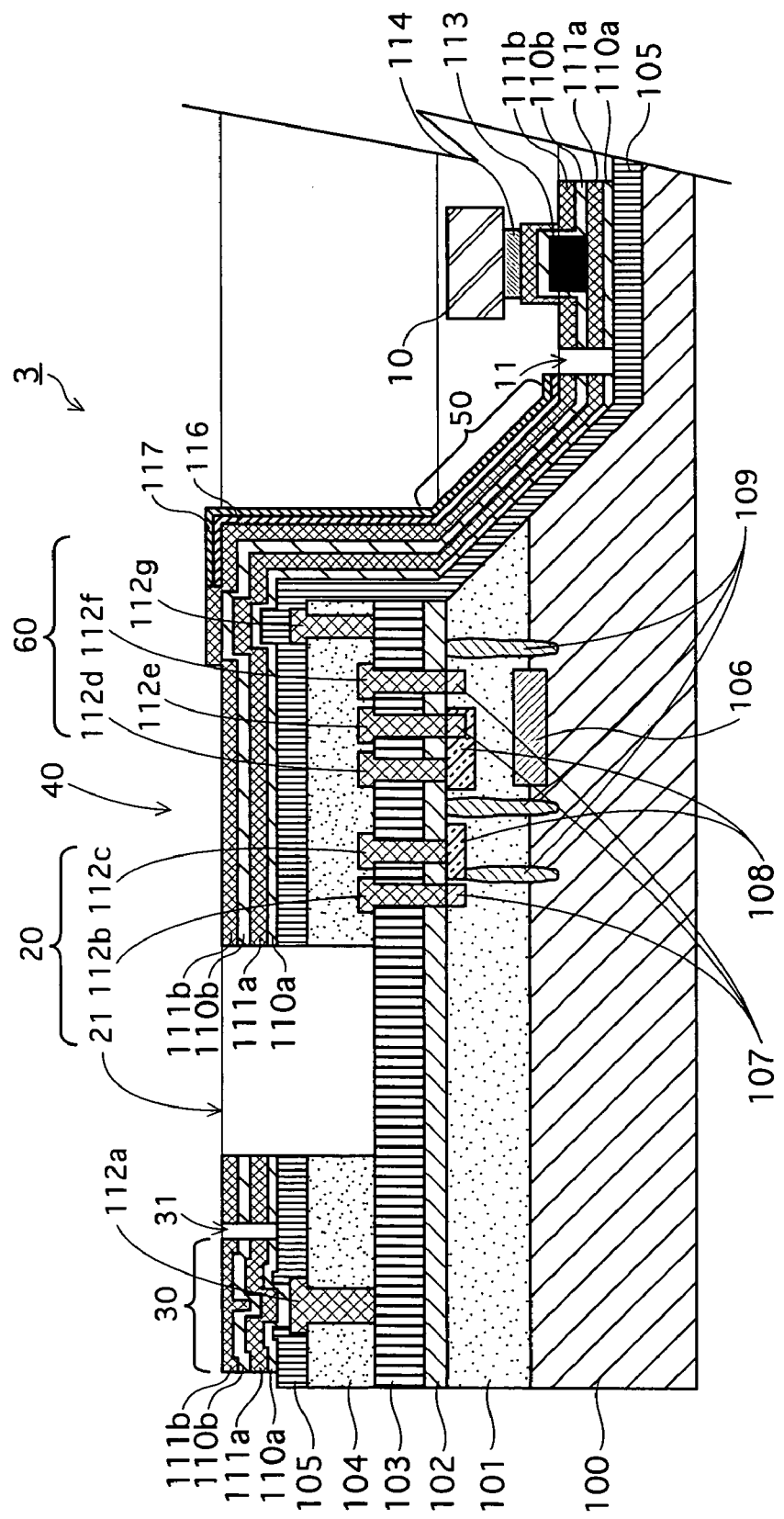
FIG. 11 is a partial perspective view of the semiconductor laser apparatus 3 of the optical pickup apparatus in Embodiment 3 of the present invention.
Figure 12A:
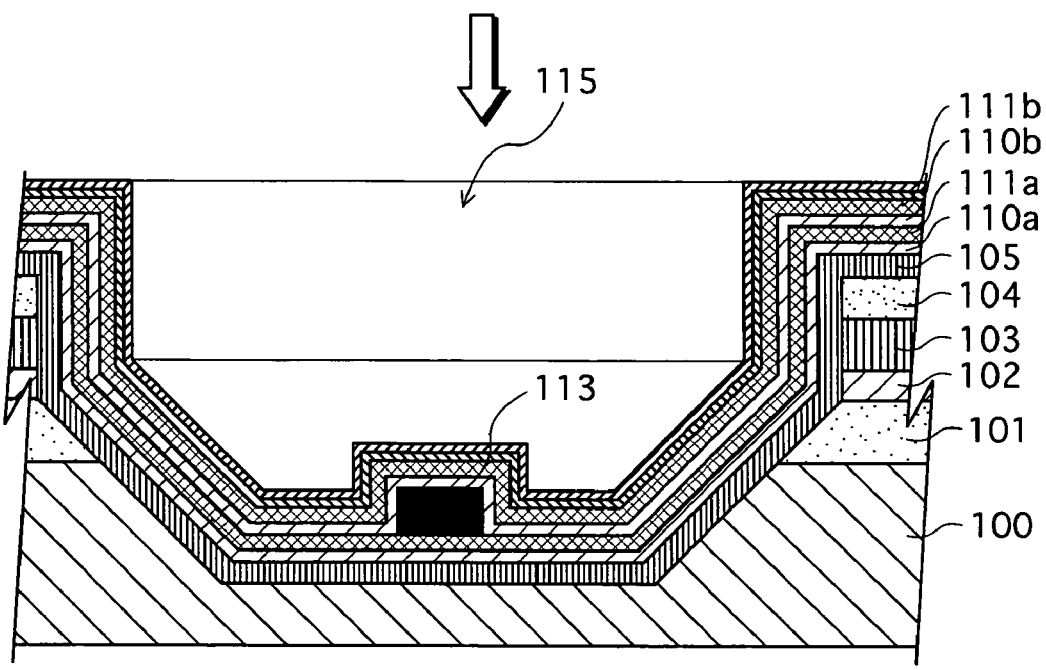
FIG. 12A is a sectional view of the semiconductor laser apparatus 3 in process when the Al layer 116 and the dielectric layer 117 have been formed.
Figure 12B:
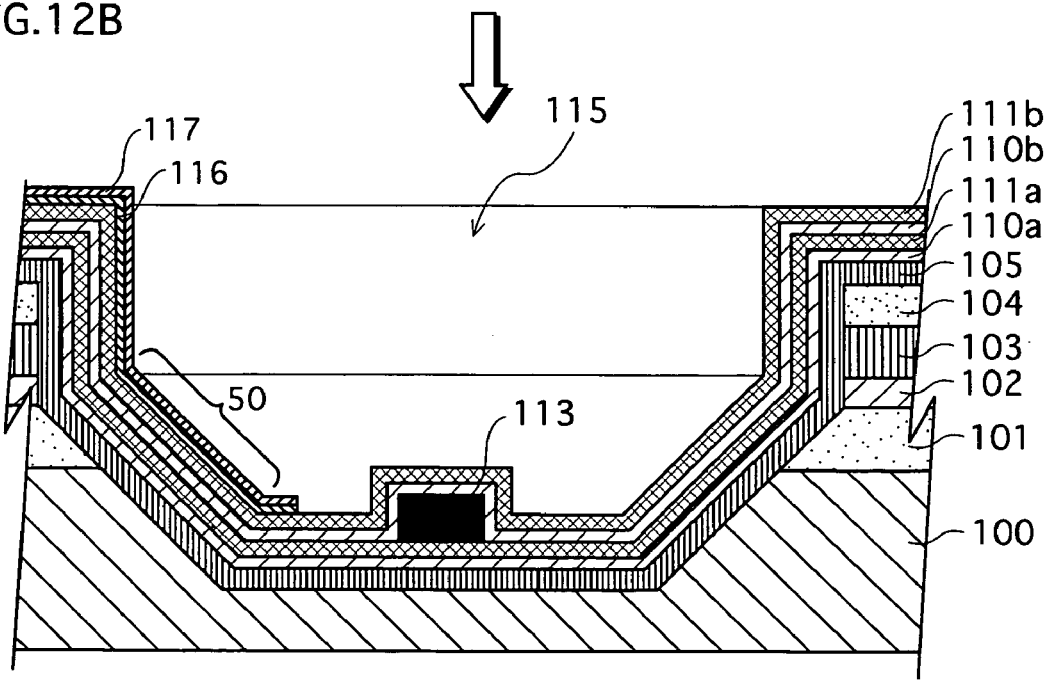
FIG. 12B is a sectional view of the semiconductor laser apparatus 3 in process when the Al layer 116 and the dielectric layer 117 have been removed except for an area covering the reflection unit 50.

FIGS. 12A and 12B show the manufacturing process of the structure shown in FIG. 11. After the step shown in FIG. 7A, the Al layer 116 and the dielectric layer 117 are further stacked. Then the Al layer 116 and the dielectric layer 117 are removed except for an area covering the reflection unit 50, by photolithography. After the reflection unit is completely formed, the process proceeds to the step shown in FIG. 7B and steps follow in the same manner as in Embodiment 1. The Al layer 116 is, for example, 400 nm thick, and the dielectric layer 117 is, for example, 100 nm thick.

The refractive index of the reflection unit 50 for a beam having a wavelength of 410 nm was measured for comparison between the different structures of the reflection unit 50. The refractive index of the reflection unit 50 whose surface is composed of an Au layer was 28%, and the refractive index of the reflection unit 50 of the present embodiment whose surface is composed of the Al layer 116 and the dielectric layer 117 was as high as 95%. As understood from this, a reflection layer having a high refractive index for blue light laser beams is obtained by merely adding the Al layer 116 and the dielectric layer 117 to the reflection unit. This enables a high-quality semiconductor blue-light-laser apparatus to be provided.

In Embodiment 3, the Al layer 116 is stacked on the Au layer 111b. However, a diffusion preventing layer composed of Ti or TiW may be inserted between the Al layer 116 and the Au layer 111b. When the Al layer 116 is stacked on the Au layer 111b directly, a reaction occurs between these layers and the accuracy is degraded. In contrast, the insertion of the diffusion preventing layer between these layers secures the accuracy in thickness with more reliability.

In Embodiment 3, the Al layer 116 is formed as a reflection layer for blue light laser beams. However, an alloy layer of Al and Cr may be formed instead to obtain the same effects.

Supplements to Embodiments

In Embodiments 1 to 3, the characteristics and advantageous effects of the present invention have been explained using a semiconductor laser apparatus for use in an optical pickup apparatus as an example. However, the present invention is not limited to a semiconductor laser apparatus for use in an optical pickup apparatus, but may be applied to a semiconductor laser apparatus having a combination of a semiconductor laser element and a reflection unit.

The optical pickup apparatus 1000 shown in FIGS. 1 and 2 is provided as an example. The present invention is not limited to the optical pickup apparatus 1000. For example, the construction unique to the present invention can be applied to the optical pickup apparatus disclosed in Japanese Laid-Open Patent Application No. 2003-281749 or Japanese Laid-Open Patent Application No. 2003-317280 to gain the same advantageous effects.

The present invention is not limited to Embodiments 1 and 2 in so far as the Ti layer 110b inserted between the heat sink layer 113 and the solder layer 114 functions as a diffusion preventing layer for preventing diffusion of Au and Sn. For example, in Embodiments 1 and 2, the Ti layers 110a and 110b are formed as the diffusion preventing layer. However, the material of the diffusion preventing layer is not limited to Ti in so far as the material has an ohmic characteristic electrically and does not form an alloy phase by reacting with the heat sink layer 113 or the solder layer 114. For example, at least one selected from a group consisting of Ti, W, and Mo may be used as the material of the diffusion preventing layer.

Also, the Au layer may be replaced with a Pt layer.

Although it is possible to replace the Al layer with an Ag layer, it is preferable to use the Al layer from the viewpoint of stability required during the manufacturing process.

Also, the present invention is not limited to the two-layer structure disclosed in Embodiments 1 and 2. For example, the present invention can be applied to a three-layer structure.

When only the Ti layer 110b is inserted between the heat sink layer 113 and the solder layer 114, the undulations of the surface become high due to a difference in the layer thickness, which makes it difficult to secure the positional accuracy of the semiconductor laser element 10. This also applies to the case where only the Au layer 111b is inserted between these layers. As a result, it is preferable that two or more layers are inserted between the heat sink layer 113 and the solder layer 114.

In Embodiments 1 and 2, the photodetector element unit 20 includes six recesses. However, the photodetector element unit 20 is not limited to this construction.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

What is claimed is:

1. A semiconductor laser apparatus comprising:
   a semiconductor substrate whose main surface has a recess, a side wall of the recess having an optical reflector that receives a laser beam and reflects the received laser beam outward in a substrate-thickness direction;
   a semiconductor laser element that is deposited in the recess and emits the laser beam toward the optical reflector in a direction substantially parallel to the main surface of the semiconductor substrate;
   a heat sink layer that is formed in a bottom face of the recess so as to adjust a position of the semiconductor laser element in the substrate-thickness direction and to let heat, which is generated as the semiconductor laser element operates, escape toward the semiconductor substrate;
   a bonding layer formed in contact with a surface, which faces the bottom face of the recess, of the semiconductor laser element; and
   a diffusion preventing layer that is embedded between the heat sink layer and the bonding layer, possesses electrical conductivity, and prevents a diffusion from occurring between the heat sink layer and the bonding layer.

2. The semiconductor laser apparatus of claim 1, wherein the diffusion preventing layer is composed of one or more elements that do not form an alloy phase by reacting with the heat sink layer or the bonding layer, and have an ohmic characteristic electrically.

3. The semiconductor laser apparatus of claim 2, wherein the bonding layer is composed of solder,
   the heat sink layer is composed of Au, and
   the diffusion preventing layer is composed of Ti or TiW and is thinner than the heat sink layer.

4. The semiconductor laser apparatus of claim 3, wherein a metal thin layer composed of Au or Pt is inserted between the bonding layer and the diffusion preventing layer.

5. The semiconductor laser apparatus of claim 3, wherein a layer composed of Ti or TiW and a metal thin layer composed of Au or Pt are inserted between the bottom face of the recess and the heat sink layer.

6. The semiconductor laser apparatus of claim 5, wherein the metal thin layer is thinner than the heat sink layer.

7. The semiconductor laser apparatus of claim 3, wherein the optical reflector is surfaced with a metal thin layer composed of Au or Pt and has a slant of substantially 45 degrees with respect to the main surface of the semiconductor substrate.

8. The semiconductor laser apparatus of claim 7, wherein the metal thin layer in the surface of the optical reflector is grounded.

9. The semiconductor laser apparatus of claim 3, wherein the optical reflector is a stack of layers including a metal thin layer as a bottom layer composed of Au or Pt, a layer composed of Al, and a dielectric layer as a top layer, a surface of the dielectric layer having a slant of substantially 45 degrees with respect to the main surface of the semiconductor substrate.

10. The semiconductor laser apparatus of claim 9, wherein
   the metal thin layer in the surface of the optical reflector is grounded.

11. The semiconductor laser apparatus of claim 3, wherein the semiconductor substrate has, at areas near the recess, a photodetector element unit for receiving laser beams, a signal processing circuit unit for processing an electric signal generated by the photodetector element unit, and a bonding pad unit via which signals are input or output from or to outside the semiconductor laser apparatus, and
   an outermost surface of the semiconductor substrate at an area in which the signal processing circuit unit and the bonding pad unit are formed is covered with a metal thin layer composed of Au or Pt.

12. The semiconductor laser apparatus of claim 11, wherein
   the metal thin layer covering the area in which the signal processing circuit unit and the bonding pad unit are formed is connected to an external terminal so that a given voltage can be applied via the external terminal from outside the semiconductor laser apparatus.

13. An optical pickup apparatus having the semiconductor laser apparatus of claim 1.

* * * * *